United States Patent [19]
Hebiguchi

[11] Patent Number: 5,801,398
[45] Date of Patent: Sep. 1, 1998

US005801398A

[54] FIELD EFFECT TRANSISTOR

[75] Inventor: Hiroyuki Hebiguchi, Miyagi-ken, Japan

[73] Assignee: Frontec Corporation, Japan

[21] Appl. No.: 543,980

[22] Filed: Oct. 17, 1995

[30] Foreign Application Priority Data

Oct. 18, 1994 [JP] Japan .................. 6-252520

[51] Int. Cl.$^6$ .......................... H01L 29/76; H01L 29/04; H01L 29/94; H01L 31/062
[52] U.S. Cl. .............. 257/66; 257/72; 257/386; 257/369
[58] Field of Search ................. 257/57, 60, 66, 257/69, 72, 280, 282, 283, 369, 386

[56] References Cited

U.S. PATENT DOCUMENTS

| | | | |
|---|---|---|---|
| 5,340,999 | 8/1994 | Takeda et al. | 257/66 |
| 5,355,002 | 10/1994 | Wu | 257/66 |
| 5,463,230 | 10/1995 | Negoto et al. | 257/66 |
| 5,576,556 | 11/1996 | Takemura et al. | 257/66 |

OTHER PUBLICATIONS

"Physics of Semiconductor Devices", Second Edition, by S.M. Sze, Bell Laboratories, Incorporated (pp. 491–492).

*Primary Examiner*—Wael Fahmy
*Attorney, Agent, or Firm*—Brinks Hofer Gilson & Lione

[57] ABSTRACT

A field effect transistor including a gate electrode, a semiconductor region, a source electrode and a drain electrode, the source and drain electrodes being formed on opposite sides of the semiconductor region and spaced apart from the gate electrode. The semiconductor region is formed such that the source and drain electrodes are in direct contact with ends of the semiconductor region, and a channel region is formed through the semiconductor region in response to a voltage applied to the gate electrode, the channel region extending from the source electrode to the drain electrode. Junctions between the source and drain electrodes and the semiconductor region are formed as an insulated area including a schottky barrier. The source and drain electrodes either have a work function which is greater than the work function of the semiconductor region (for p-channel transistors), or a work function which is less than the work function of the semiconductor region (for n-channel transistors). A width of the semiconductor region is less than or equal to a width of the gate electrode plus two times the thickness of the insulating film.

14 Claims, 8 Drawing Sheets

FIELD EFFECT TRANSISTOR

BACKGROUND OF THE INVENTION

1. Field of the Invention

The present invention relates to a field effect transistor having employed a particular structure on a semiconductor region provided between a source electrode, a drain electrode and a gate electrode.

2. Description of the Prior Arts

FIG. 16 and FIG. 17 show an example of structure of a conventional thin film transistor array substrate for driving a liquid crystal panel which is already popular as an element to which a field effect transistor has been applied. A thin film transistor (TFT) T as a switching element in this example is an application example of an n-channel type a-Si:H (hydrogenated amorphous silicon) TFT and can be constituted by the method comprising the steps of forming a gate electrode 2 on the upper surface of a substrate 1 consisting of a transparent glass material etc., covering this gate electrode 2 with a gate insulating film 3, forming an island type semiconductor film 4 with a-Si (i) (intrinsic amorphous silicon) on this gate insulating film 3, forming ohmic contact films 6 and 7 consisting of a-Si (n+) (ion-doped amorphous silicon) in such a manner as sandwiching an etching stopper film 5 formed on the semiconductor film 4, providing an etching stopper film 5 between above ohmic contact films and providing a source electrode 8 and a drain electrode 9 on the ohmic contact films 6 and 7 in such a manner as sandwiching the etching stopper film 5.

In the thin film transistor array substrate described above, gate wirings 15 and source wirings 16 are formed in the shape of a matrix on the substrate 1 through the gate insulating film 3, a gate electrode 2 is formed branching from a part of the gate wirings 15 at the internal side of each intersecting point of the gate wirings 15 and the source wirings 16, a source electrode 8 is formed branching from a part of the source wirings 16 and a drain electrode 9 is connected to pixel electrodes 17 for driving a liquid crystal.

The thin film transistor in the structure explained above can be driven by forming a region causing the carrier to move, that is, a channel 10 at a part near the gate electrode in the bottom part of a semiconductor active film 4 by applying a voltage to the gate electrode 2 to have the field act on the semiconductor active film 4 and by controlling a current flowing between the source electrode 8 and the drain electrode 9 with the voltage applied to the gate electrode 2.

Here, the inventors of the present invention have proved by investigation that the channel 10 formed on the semiconductor active film 4 is not extended, in the thin film transistor having the structure shown in FIG. 16, between both end regions of the semiconductor active film 4. Instead, the channel 10 is formed only at the central region of the semiconductor active film 4, that is, at the region indicated by a chain line in FIG. 16. Therefore, the channel 10 is not placed directly in contact with the source electrode 8 and drain electrode 9 and it has been conductive, as a result, with the source electrode 8 and the drain electrode 9 through the ohmic contact films 6 and 7 and a conductive region 12 (a part of the semiconductor region between the channel 10 and ohmic contact films 6 and 7).

However, since the conductive region 12 has a higher resistance because the semiconductor active film 4 is formed of an intrinsic amorphous silicon, and the resistance of this region almost dominates the ON resistance of the thin film transistor, it has been required to realize the conductive condition with lesser resistance in place of the conductive condition attained through such conductive region 12 in order to further improve the efficiency of the thin film transistor by lowering the ON resistance.

Moreover, in the conventional structure shown in FIG. 16, ohmic contact films 6 and 7 have been provided to prevent the conductive condition by p-channel under the inverse bias, but it has been required, after formation of the source electrode 8 and drain electrode 9, to form a part between the source electrode 8 and the drain electrode 9, namely a part on the channel 10.

That is, on the occasion of fabricating a thin film transistor by employing a method that a source electrode 8, a drain electrode 9 or ohmic contact film 4 is formed by the photolithographic process to form the predetermined pattern by sequentially stacking various films with a film forming method and then eliminating unwanted regions of these films by the etching process, the following steps have been required, that is, a film to form an ohmic contact film is formed before formation of the films to form a source electrode and a drain electrode, the source electrode 8 and drain electrode 9 are formed in the predetermined patterns by etching the films to form the source electrode and drain electrode, and thereafter the film to form the ohmic contact film remaining under these electrodes regions is eliminated by the etching process.

Moreover, since the semiconductor active film 4 on the channel is somewhat damaged by this etching process bringing about a flow of a leak current, it has been solved in the existing structure shown in FIG. 16 by providing an etching stopper film 5. However, this structure requires the process to form this etching stopper film 5 and thereby the etching process for this purpose is also required, complicating the fabricating processes and lowering the fabrication yield.

Next, FIG. 18 shows an example of structure of an existing CMOS type transistor. In this structure, since a p-channel transistor 15 and an n-channel transistor 16 are formed on an n⁻ type substrate 17, both transistors are usually separated by an insulating film 17 and a guard ring (p⁺) for isolation.

Namely, in the p-channel transistor 15, the numerals 20 and 21 designate a source electrode and a drain electrode (these are of the p⁺ type) which are separately formed in the substrate 17, a gate electrode 23 covered with an insulating film 22 is formed at the upper part of the region provided between the source electrode 20 and the drain electrode 21, and the source electrode 20 is connected to a source wiring 24, while the drain electrode 21 is connected to a drain wiring 25.

Moreover, in the n-channel transistor 16, a p-well (p⁻) region 19 is formed in the upper part of the substrate 17, a source electrode 30 and a drain electrode 31 (these are of the n⁺ type) are separately formed in the right and left sides of the upper part of the p-well region, a gate electrode 33 covered with an insulating film 32 is formed at the upper part of the area provided between the source electrode 30 and the drain electrode 31, and the source electrode 30 is connected to a source wiring 34 while the drain electrode 31 is connected to a drain wiring 35.

Therefore, in the transistor formed in the existing structure, the n⁺ source electrode and drain electrode have been formed on the p⁻ substrate to form the n-channel, while the p⁺ source electrode and drain electrode have respectively been formed on the n⁻ substrate to form the p-channel.

Accordingly, in view of fabricating a CMOS type transistor of the existing structure shown in FIG. 18, a p⁻ region (p-well region 19) is formed to form the n-channel transistor when the n⁻ substrate 17 is used, next a gate electrode is formed upon formation of the guard ring 18 to insulate between the n⁻ substrate 17 and the p-well region 19 and thereafter the p⁺ type diffused layers must be separately formed in the n-channel source and drain electrodes, bringing about a drawback that the manufacturing process is rather complicated.

Moreover, since the n-channel transistor 16 can be formed only in the p-well region 19, while the p-channel transistor can be formed only in the n⁻ substrate 17, a method to arrange to a certain degree the n-channel and p-channel transistors together has been employed but a degree of freedom for the layout has been sacrificed.

In addition, since the structure shown in FIG. 18 is required to surround the p-well region 19 with the guard ring 18, here rises a problem that a degree of freedom for the layout explained above is lowered and the effective area efficiency of the substrate is also inevitably lowered.

SUMMARY OF THE INVENTION

The present invention has been proposed considering the aforementioned background and therefore it is an object of the present invention to provide a field effect transistor which can freely eliminate an ion-doped semiconductor film which has been required to be formed between a source electrode, a drain electrode and a semiconductor region, ensure good contact even if this film is eliminated, and can easily generate n-channel and p-channel transistors only with material selection of the source electrode and drain electrode to form a plurality of field effect transistors on a substrate.

In view of solving the problems explained above, according to one aspect of the present invention, there is provided a structure of the field effect transistor having formed a source electrode, a drain electrode and a gate electrode provided opposed to these two electrodes on a substrate, in which a semiconductor region is provided, as the means for solving the problems, between the source electrode and drain electrode, the source electrode, drain electrode and gate electrode are respectively provided opposed with each other through an insulating film, a channel generating means for generating a channel with a voltage of the gate electrode is formed in the gate electrode side of the semiconductor region, and an end region of the channel generating means is directly connected with the drain electrode and source electrode.

In the structure of the field effect transistor according to the above aspect of the present invention, a junction area between the source electrode and drain electrode and the channel generating means is preferably formed as the insulated area having a schottky barrier.

Next, in the field effect transistor according to the above and another aspects of the invention, the gate electrode formed on the substrate is covered with a gate insulating film, a semiconductor region is formed on this gate insulating film and the source electrode and drain electrode are formed in both sides of the semiconductor region covering the end portion of the semiconductor region to realize a field effect transistor for driving a liquid crystal.

Moreover, in the field effect transistor according to the above aspects, the gate electrode covered with the insulating film is provided on the semiconductor region formed on the upper part of the substrate, and the source electrode and drain electrode are formed in both sides of the insulating film covering the gate electrode and in both sides of the semiconductor region to realize an MOS type field effect transistor.

Next, in the structure of the field effect transistor having the constitution explained above, the drain electrode and source electrode can be constituted, as the n-channel electrodes, with a material having a work function which is smaller than that of the semiconductor constituting the semiconductor region. In this case, as a practical material, any one of Al, Ti, Cr, In, Ta, Cs, indium-tin oxide, BaO, SrO and a material mixing these can be selected. Moreover, in the above structure of the field effect transistor, the drain electrode and source electrode can be constituted, as the p-channel electrodes, with a material having a work function which is larger than that of the semiconductor constituting the semiconductor region. In this case, as a practical material, any one of Pt, Au, W, Ni, Mo and a material mixing these can be selected.

Moreover, in the field effect transistors described above, the semiconductor region can be directly connected with the source electrode and drain electrode not by way of an ion-doped semiconductor film.

In addition, in the field effect transistors described above, the semiconductor region having the width extending in the direction to the drain electrode from the source electrode can be formed in the width not wider than that of the gate electrode formed along the direction explained above.

Furthermore, in the field effect transistors described above, the semiconductor region having the width extending in the direction to the drain electrode from the source electrode can be formed in the width wider than that of the gate electrode formed along the direction explained above, and a difference between the width of the semiconductor region and the width of the gate electrode can be set within two times the thickness of the insulating film formed around the gate electrode.

Meanwhile, in the case of forming two or more field effect transistors of the structure explained above on a substrate, at least one of these field effect transistors may be formed as an n-channel transistor of the structure proposed in the third aspect of the present invention and at least one of these field effect transistors may be formed as a p-channel transistor of the structure proposed in the fourth aspect of the present invention.

In the structure of a field effect transistor in which a source electrode and a drain electrode are connected with a semiconductor region, since a part which generates a channel in the semiconductor region depending on a voltage of a gate electrode, namely the channel generating means is directly connected with the source electrode and drain electrode, the channel generated ensures reliable contact between the source electrode and the drain electrode to realize better contact than that of the existing structure.

Moreover, when the junction area between the source electrode, drain electrode and the semiconductor region is formed as the insulated area having a schottky barrier, since the p-channel conductivity is eliminated under the inverse bias condition for the n-channel structure, the ion-doped semiconductor film which has been required in the prior art is no longer necessary and thereby the film forming process and etching process can be simplified.

Next, with employment of the structure explained above, the source electrode and drain electrode can be constituted, as the n-channel electrodes, with a material having a work function which is smaller than that of the semiconductor forming the semiconductor region. In more practical, any one can be selected from Al, Ti, Cr, In, Ta, Cs, indium-tin oxide, BaO and SrO. Moreover, with employment of the structure described above, the drain electrode and source electrode can also be constituted, as the p-channel electrodes with a material having a work function which is larger than that of the semiconductor forming the semiconductor region. In more practical, any one can be selected from Pt, Au, W, Ni and Mo.

Next, employment of the structure explained above has ruled out the ion-doped semiconductor film which has been required in the prior art, enabling omission of the film forming process and etching process required for such film. Moreover, even when the semiconductor region is formed narrower or wider than the width of gate electrode, if the width of the semiconductor region is smaller than the value which is obtained by adding two times the thickness of the insulating film to the width of the gate electrode, the channel is surely connected with the source and drain electrodes and thereby good conductivity between the source and drain electrodes can also be achieved.

Meanwhile, in the case of providing a plurality of field effect transistors of the structure explained above on a substrate, the n-channel and p-channel field effect transistors can easily be formed on the substrate by selecting the material of the source electrode and drain electrode described previously.

DESCRIPTION OF THE PREFERRED EMBODIMENTS

The preferred embodiments of the present invention will be explained with reference to the accompanying drawings.

Figure 1:
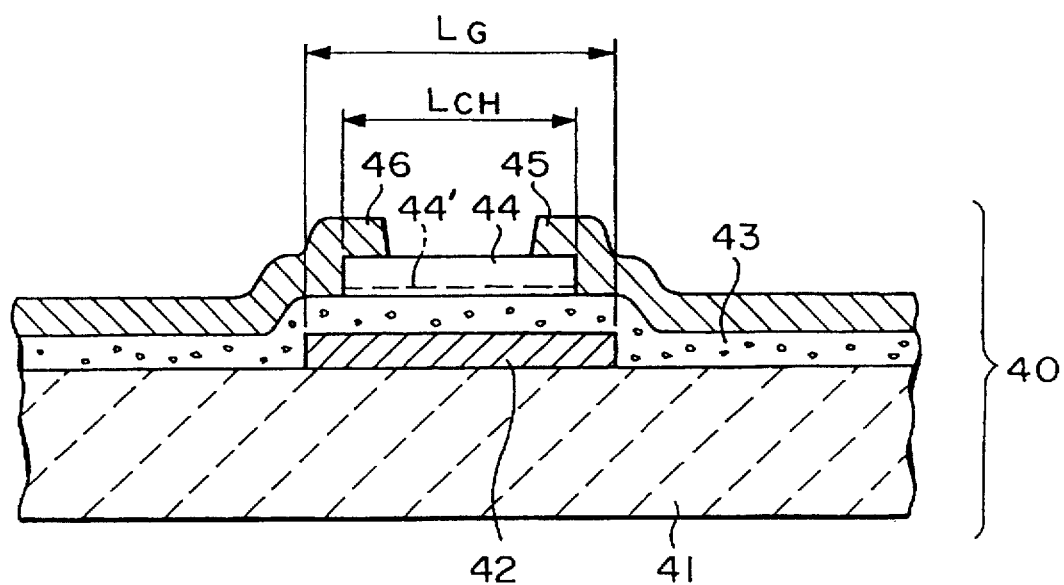
FIG. 1 is a cross-sectional view illustrating a first embodiment of the present invention applied to a thin film transistor array substrate.

FIG. 1 shows an embodiment of the present invention applied to an active matrix type thin film transistor array substrate. In a thin film transistor array substrate 40 of this embodiment, a gate electrode 42 is formed on a transparent substrate 41 formed of a glass plate, this gate electrode 42 and the substrate surface are covered with a gate insulating film 43, a semiconductor active film (semiconductor region) 44 is formed on the flat area of the gate insulating film on the gate electrode 42 and a source electrode 45 and a drain electrode 46 are formed opposed to each other on the right and left sides in such a manner as to cover the right and left end portions (shown in FIG. 1) of the semiconductor active film 44.

In this embodiment, the width of the gate electrode 42 extended along the direction to the drain electrode 46 from the source electrode 45 is identified as $L_G$ (as shown in FIG. 1) and the width of the semiconductor active film 44 extended along the same direction is identified as $L_{CH}$. In this embodiment, the respective widths are set so that the relationship $L_G \geq L_{CH}$ is established between the width $L_G$ of the gate electrode 42 and the width $L_{CH}$ of the semiconductor active film 44. Moreover, a part of the semiconductor active film 44 closest to the gate electrode 42 is defined as a channel generating region 44' and this channel generating region 44' is connected at both end regions with the source electrode 45 and drain electrode 46.

The channel generating region 44' is a region which is generated as a carrier transferring region in the semiconductor active film 44 when an appropriate voltage is applied to the gate electrode 42.

When the widths of the gate electrode 42 and semiconductor active film 44 are specified to satisfy the relationship $L_G \geq L_{CH}$ explained above, the channel is surely formed between both end regions of the semiconductor active film 44 when an appropriate voltage is applied to the gate electrode 42 and thereby the channel is surely connected with the source electrode 45 and drain electrode 46. Junction areas between the semiconductor active film 44, the source electrode 45 and drain electrode 46 are insulated the generation of a schottky barrier through the selection of materials as explained below.

Figure 16:
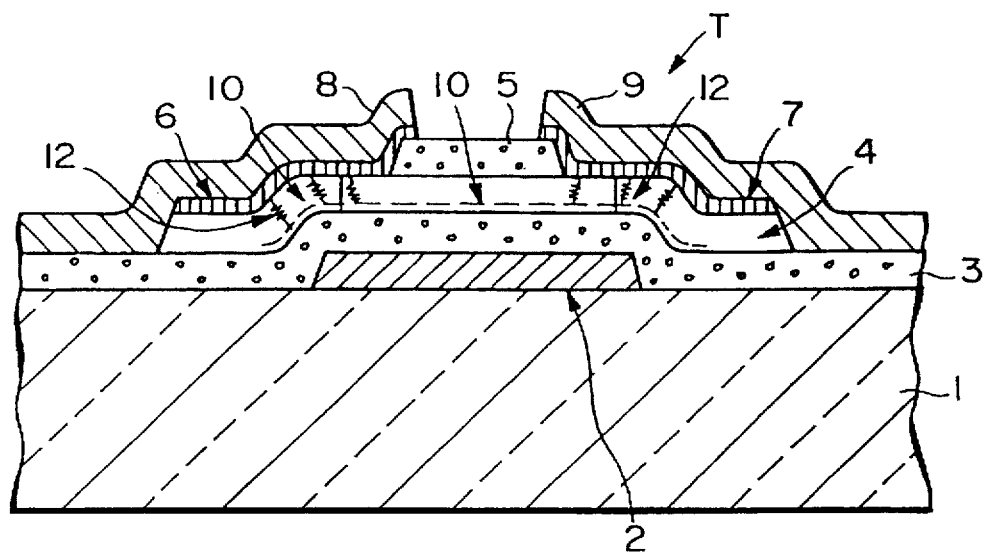
FIG. 16 is a cross-sectional view illustrating an example of a thin film transistor array substrate of the prior art.
Figure 17:
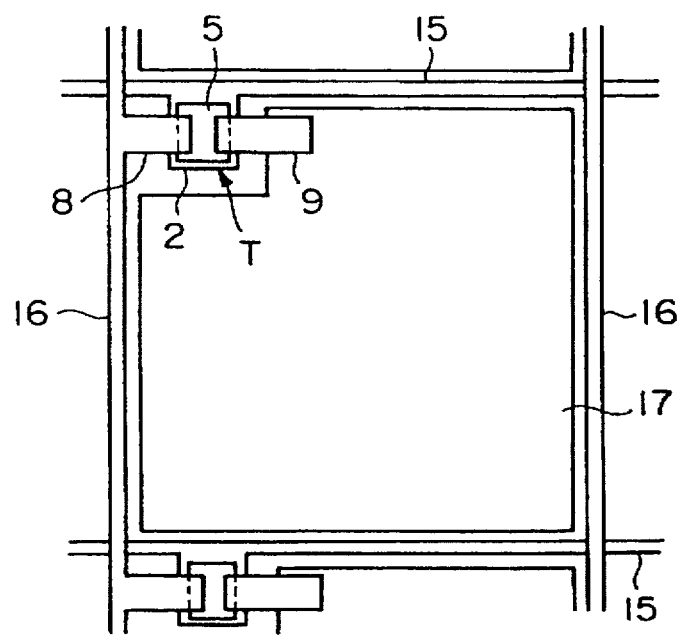
FIG. 17 is a plan view of the thin film transistor array substrate shown in FIG. 16.

Therefore, the channel is in the complete contact with the source electrode 45 and drain electrode 46, making unnecessary the ohmic contact films 6 and 7 which have been required in the structure of the prior art as shown in FIG. 16. In the case of n-channel transistor, since these ohmic contact films 6 and 7 become the n⁺ layers which are formed by ion-implantation of high concentration impurity, the manufacturing process of the n-channel transistor can be simplified because these processes may be omitted. Moreover, in the structure of the prior art shown in FIG. 16, an etching stopper film 5 has been provided in order to eliminate influence of the etching process which is conducted to form the ohmic contact films 6 and 7, but in the structure of this embodiment, the ohmic contact films 6 and 7 are no longer required and therefore the etching stopper film 5 can also be eliminated.

Therefore, when the structure explained above is employed, the processing steps can be remarkably simplified in comparison with that of the structure of the prior art shown in FIG. 16, resulting in improvement of manufacturing yield and realization of low cost.

The gate electrode 42 mentioned above is preferably formed of a well known conductive material selected from Cr, Al, Ta or a composite film of these materials. The gate insulating film 43 mentioned above is preferably formed of a well known insulating material such as $SiN_x$. Moreover, the semiconductor active film 44 also mentioned above is formed of an intrinsic a-Si:H (hydrogenated amorphous silicon).

Next, in the case of forming an n-channel thin film transistor, as a material of the source electrode 45 and drain electrode 46, a conductive material having a work function which is smaller than that of Si forming the semiconductor active film 44, for example, an oxide conductive material such as Al, Ti, Cr, In, Ta, ITO, BaO, SrO, Cs or a material mixing such materials is preferably used.

In addition, in the case of forming a p-channel thin film transistor, as a material of the source electrode 45 and drain electrode 46, a conductive material having a work function which is larger than that of Si forming the semiconductor active film 44, for example, Pt, Au, W, Ni, Mo or a material mixing these materials is preferably used.

When the material selection is performed as explained above, junction areas between the semiconductor active film 44 and the source electrode and drain electrode are formed to have an insulated structure including a schottky barrier.

In a thin film transistor of the structure described above, since the junction areas between the source electrode 45 and drain electrode 46, and the semiconductor active film 44 includes the schottky. barrier, the source electrode 45 and the drain electrode 46 become conductive only when any one of the n-channel and p-channel is formed. Therefore, a conductive channel of the n-channel and p-channel is determined depending on the relationship between the work functions of the conductive materials used for the source electrode 45 and drain electrode 46 and the semiconductor active film 44 because the upper or lower bending direction of energy-band of the semiconductor active film 44 is determined by the schottky junction area. Therefore, the thin film transistor in the structure explained in this embodiment can easily select the p-channel or n-channel by selecting a conductive material as explained above.

Figure 2:
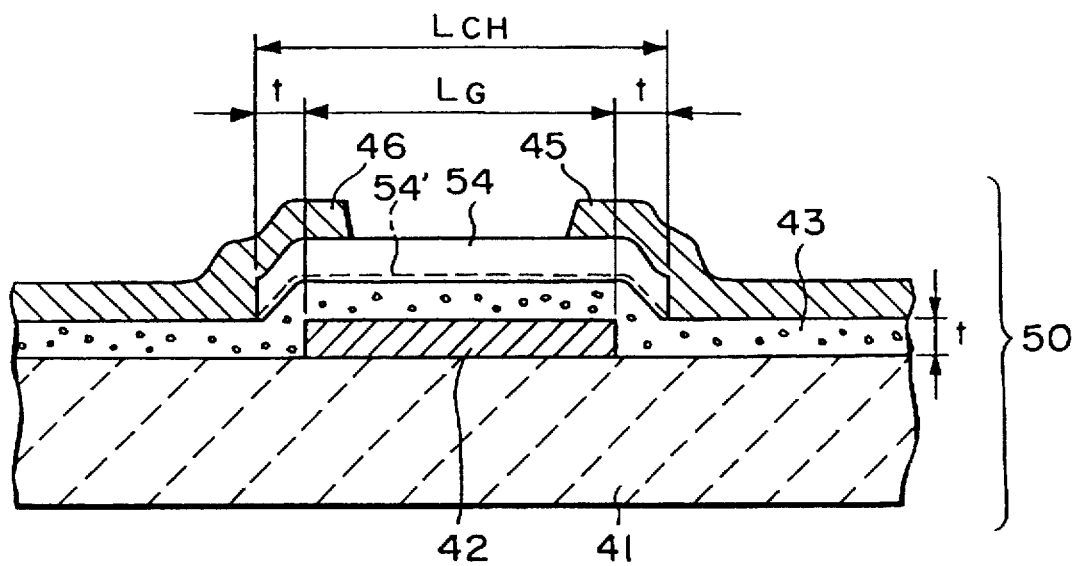
FIG. 2 is a cross-sectional view illustrating a second embodiment of the present invention applied to a thin film transistor array substrate.

FIG. 2 shows a second embodiment of the present invention applied to an active matrix type thin film transistor array substrate. The constitutional elements of a thin film transistor array substrate 50 of this second embodiment which are similar to those of the thin film transistor array substrate 40 of the preceding embodiment are designated by the similar reference numerals and explanations of these elements are not repeated.

The thin film transistor array substrate 50 of this embodiment is different from the thin film transistor array substrate 40 of the preceding embodiment only in the point that a semiconductor active film (semiconductor region) 54 is formed extending to the right and left sides exceeding the flat area of the gate insulating film 43 on the gate electrode 42, and a channel generating region 54' is extending to the right and left sides from the flat area of the gate insulating film 43 and is connected with the source electrode 45 and drain electrode 46.

Here, if the width of the gate electrode 42 is $L_G$, the width of the semiconductor active film 54 is $L_{CH}$ and the thickness of the gate insulating film 43 as t, these elements have to be formed to satisfy the relationship, $L_{CH} \leq L_G + 2t$.

Because the width of a channel generated in the semiconductor active film 54 due to a voltage of the gate electrode 42 is similar to the thickness of the gate insulating film 43 and the semiconductor active film 54 of the width described above, the thin film transistor 50 generates the channel which sufficiently attains the object of the present invention.

Figure 3:
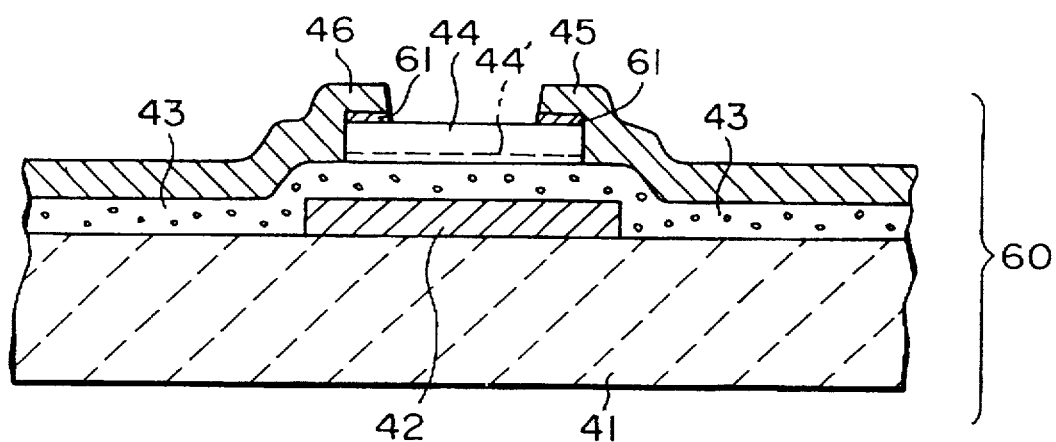
FIG. 3 is a cross-sectional view illustrating a third embodiment of the present invention applied to a thin film transistor array substrate.

FIG. 3 shows a third embodiment of the present invention applied to an active matrix type thin film transistor array substrate. In the thin film transistor array substrate 60 of this embodiment, the constitutional elements similar to those of the thin film transistor array substrate 40 of the preceding embodiment are designated by the similar reference numerals and explanations of these elements are not repeated.

The thin film transistor array substrate 60 of this embodiment is different from the thin film transistor array substrate 40 of the preceding embodiment only in that an ohmic contact film 61 consisting of a-Si ($n^+$) is respectively formed between the upper surface of the semiconductor active film 44 and the source electrode 45 and between the upper surface of the semiconductor active film 44 and the drain electrode 46.

When the channel generating region 44' of the semiconductor active film 44 is placed in contact with the source electrode 45 and drain electrode 46 and is further placed in contact with the ohmic contact films 61, as in this embodiment, the ON resistance is reduced more than in the prior art because the direct contact area is added to a current path through the channel generating region 44' in addition to a current path through the conductive regions 12 (see FIG. 16) which have controlled the ON resistance. Here, the other effects are similar to that of the structure of the first embodiment shown in FIG. 1.

Figure 4:
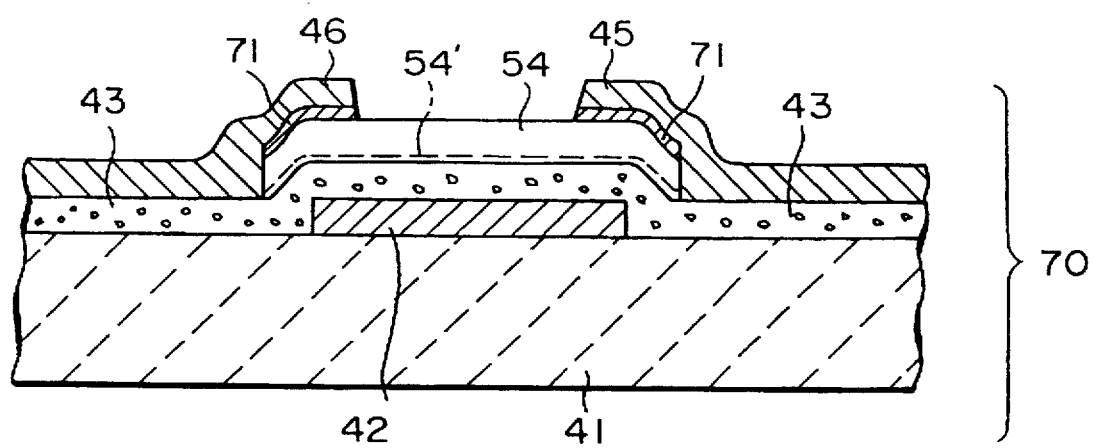
FIG. 4 is a cross-sectional view illustrating a fourth embodiment of the present invention applied to a thin film transistor array substrate.

FIG. 4 shows a fourth embodiment of the present invention applied to an active matrix type thin film transistor array substrate. In the thin film transistor array substrate 70 of this embodiment, the constitutional elements similar to that of the thin film transistor array substrate 50 of the preceding embodiment are designated by the similar reference numerals and explanations of these elements are not repeated.

The film transistor array substrate 70 of this embodiment is different from the thin film transistor array substrate 50 of the preceding embodiment in that ohmic contact films 71 consisting of a-Si ($n^+$) are respectively formed between the upper surface of the semiconductor active film 54 and the source electrode 45 and between the upper surface of the semiconductor active film 54 and the drain electrode 46.

In this embodiment, when the channel generating region 54' of the semiconductor active film 54 is placed in contact with the source electrode 45 and the drain electrode 46 and is then further placed in contact with the ohmic contact films 71, the ON resistance is reduced more than in the prior art because the direct contact area is added to a current path through the channel generating region 54' in addition to a current path through the conductive regions 12 (see FIG. 16)

which have controlled the ON resistance. Here, the other effects are similar to that of the structure of the second embodiment shown in FIG. 2.

Figure 5:
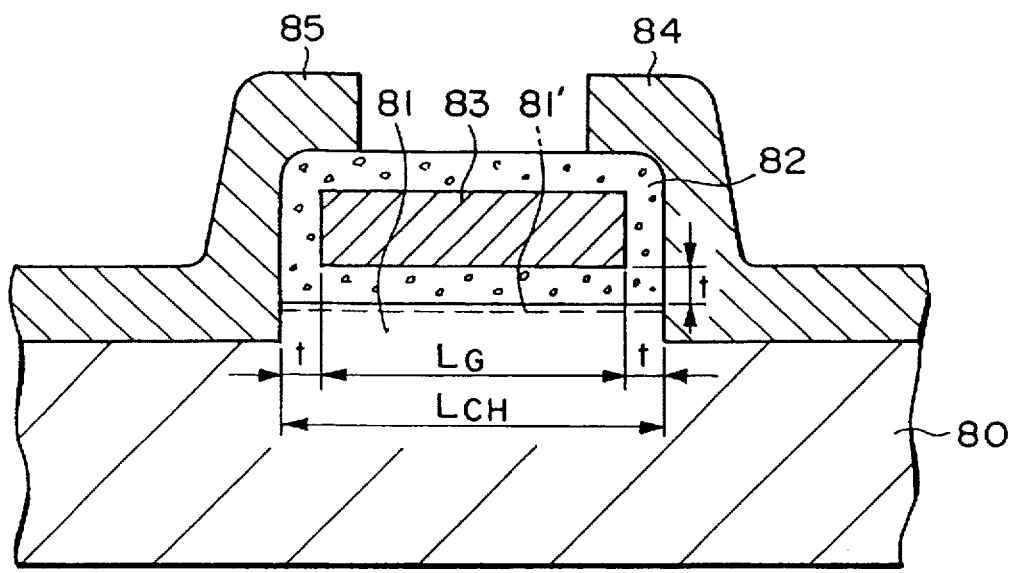
FIG. 5 is a cross-sectional view illustrating a fifth embodiment of the present invention applied to a MOS transistor.

FIG. 5 shows a fifth embodiment of the present invention applied to a MOS transistor. In this embodiment, a projected semiconductor region 81 is formed on the upper surface of a high resistance semiconductor substrate 80, a gate electrode 83 surrounded by an insulating film 82 is provided on this semiconductor region 81 and the source electrode 84 and drain electrode 85 are formed on the right and left sides of the gate electrode 83 in such a manner as sandwiching the gate electrode 83 through the peripheral insulating film 82. The semiconductor region 81 is sandwiched by the source electrode 84 and drain electrode 85 from the right and left sides and a part of this semiconductor region 81 in the gate electrode side is defined as the channel generating region 81' which is in contact with the source electrode 84 and drain electrode 85.

In the structure of this embodiment, the widths of the gate electrode 83 and semiconductor region 81 are set equal to those in the second embodiment explained previously with reference to FIG. 2. That is, when the width of the gate electrode 83 is $L_{OG}$, the width of the semiconductor region 81 is $L_{OCH}$ and the thickness of the gate insulating film 82 as $t_0$, these elements are formed satisfying the relationship $L_{OCH} \leq L_{OG} + 2t_0$.

Moreover, an area where the region other than the channel generating region 81' of the semiconductor region 81 is connected with the source electrode 84 and drain electrode 85 is insulated by the schottky barrier. The semiconductor should preferably have a high resistance (with low impurity concentration) in order to ensure good insulation property by the schottky barrier and reduce electric capacitance of a depletion layer.

Figure 6:
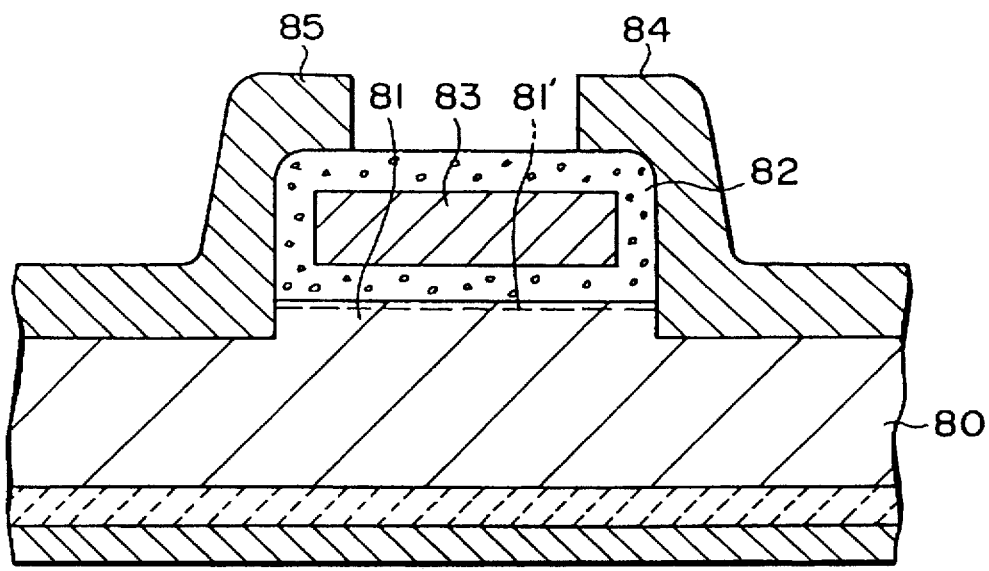
FIG. 6 is a cross-sectional view illustrating a sixth embodiment of the present invention applied to a MOS transistor.

FIG. 6 shows a sixth embodiment of the present invention applied to the MOS transistor shown in FIG. 5 in the structure considering the substrate contact. In this embodiment, a low resistance semiconductor layer 87 and a substrate electrode layer 88 are formed at the rear surface of the substrate 80 to ensure the substrate contact from the substrate electrode 88.

A MOS transistor is constituted in this embodiment using a high resistance semiconductor substrate, but a MOS transistor can also be formed on this high resistance semiconductor layer by epitaxially forming a high resistance semiconductor layer on a low resistance semiconductor substrate.

Next, a method of manufacturing a MOS transistor of the structure shown in FIG. 5 will be explained with reference to FIGS. 7 through 14.

Figure 7:
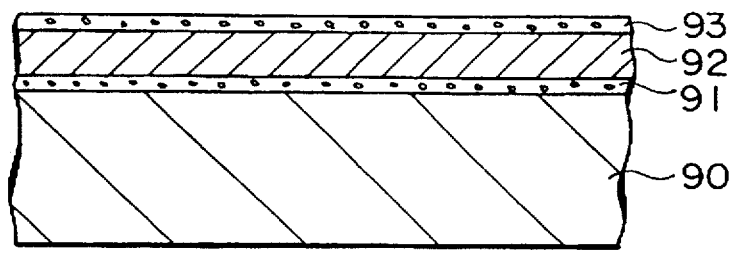
FIG. 7 is a cross-sectional view to explain a method of manufacturing a MOS transistor, illustrating the condition where an oxide layer is stacked on the substrate.

In order to fabricate this MOS transistor, a gate insulating film 91 consisting of $SiO_2$ is formed, as shown in FIG. 7, by oxidizing the surface of a high resistance Si substrate 90, an electrode layer 92 consisting of poly-Si etc. is further formed to form a gate electrode and moreover an insulating film 93 consisting of $SiO_2$ is formed thereon.

Figure 8:
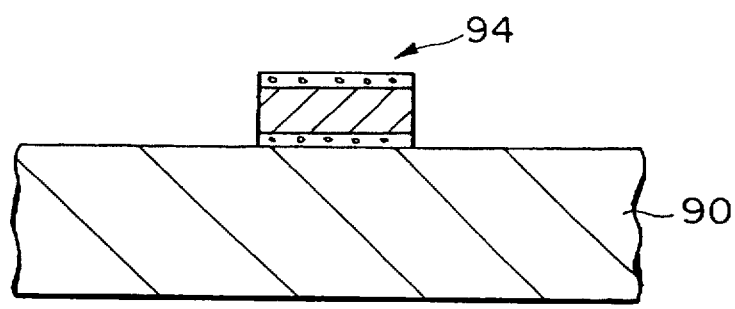
FIG. 8 is a cross-sectional view to explain the method of manufacturing a MOS transistor, illustrating the condition where the oxide layer is eliminated by the etching to form a gate electrode region.

Next, the region where the gate electrode is not formed is removed by the method such as reactive ion beam etching to form an island type electrode region 94 as shown in FIG. 8.

Figure 9:
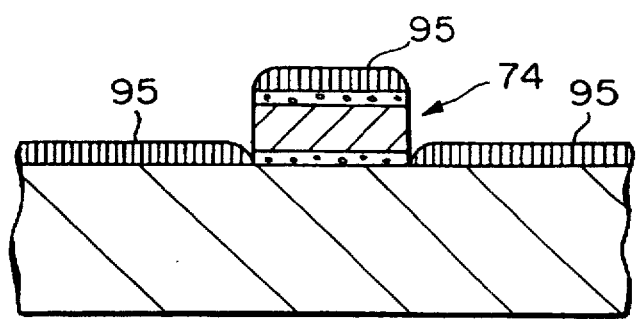
FIG. 9 is a cross-sectional view to explain the method of manufacturing a MOS transistor, illustrating the condition where an insulating film is formed on the substrate.
Figure 10:
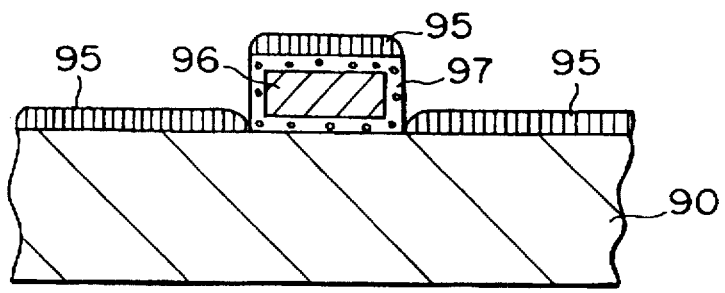
FIG. 10 is a cross-sectional view to explain the method of manufacturing a MOS transistor, illustrating the condition where the side surface of the electrode region is oxidized.

Next, an insulating film 95 consisting of $Si_3N_4$ is formed as shown in FIG. 9 by the method such as sputter or vacuum deposition. However, at the time of forming this film, the insulating film 95 of $Si_3N_4$ is not formed at the side surface of the electrode region 94.

Figure 11:
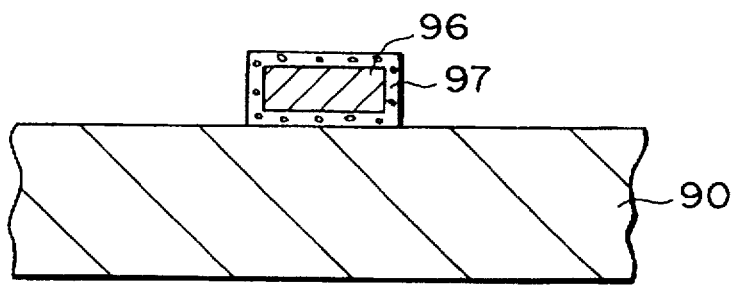
FIG. 11 is a cross-sectional view to explain the method of manufacturing a MOS transistor, illustrating the condition where the insulating film on the substrate is removed.

Thereafter, the processed substrate 90 is oxidized. In this case, since the insulating film 95 consisting of $Si_3N_4$ functions to prevent oxidization, the inside of the substrate 90 is not oxidized and only the side surface of the exposed electrode region 94 is oxidized to form a gate electrode 96 and an insulating film 97 surrounding the electrode as shown in FIG. 11. During this oxidation process, thickness of the oxide film is controlled to satisfy the relationship $L_{OCH} \leq L_{OG} + 2t_0$ explained previously.

Figure 12:
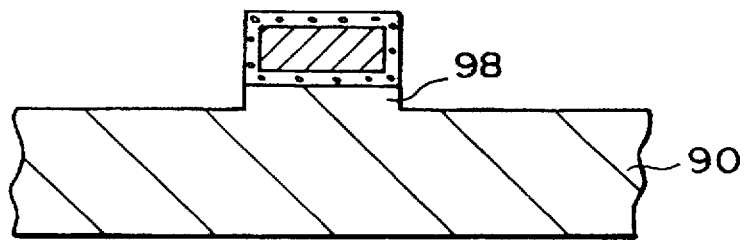
FIG. 12 is a cross-sectional view to explain the method of manufacturing a MOS transistor, illustrating the condition where the substrate surface surrounding the electrode region is etched by ion beam.
Figure 13:
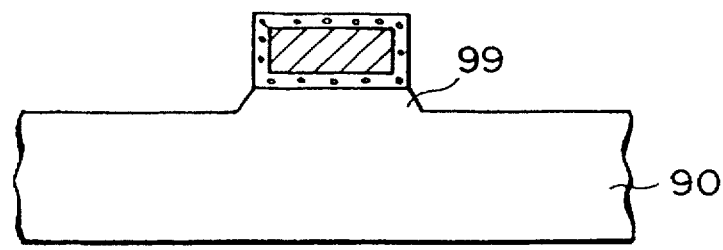
FIG. 13 is a cross-sectional view to explain the method of manufacturing a MOS transistor, illustrating the condition where the substrate surface surrounding the electrode region is wet-etched.

Next, as shown in FIG. 11, the insulating film 95 consisting of $Si_3N_4$ is removed and the Si substrate region 90 is etched using the insulating film consisting of $SiO_2$ surrounding the gate electrode 96 as a mask. In this case, it is sufficient that the etching is performed to such a depth as to form a channel. Here, FIG. 12 shows a cross-sectional view of a semiconductor region 98 formed by the reactive ion beam etching process, while FIG. 13 shows a cross-sectional view of a semiconductor region 99 obtained by crystal axis anisotropic etching of the Si substrate 90 using aqueous solution of KOH. Such difference in the etching methods results in a little difference in the shape of the semiconductor region.

Figure 14:
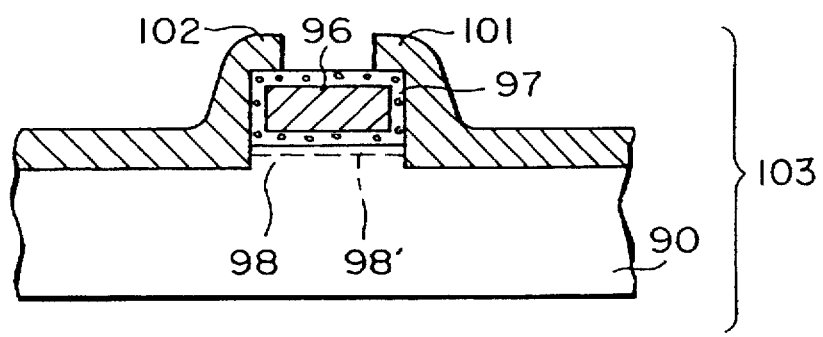
FIG. 14 is a cross-sectional view to explain the method of manufacturing a MOS transistor, illustrating a completed MOS transistor.

Next, a source electrode 101 and a drain electrode 102 can be formed as shown in FIG. 14 by forming and patterning a conductive film on the processed substrate 90 shown in FIG. 12, completing an MOS transistor 103 provided with the semiconductor region 98 having a channel generating region 98'.

Figure 15:
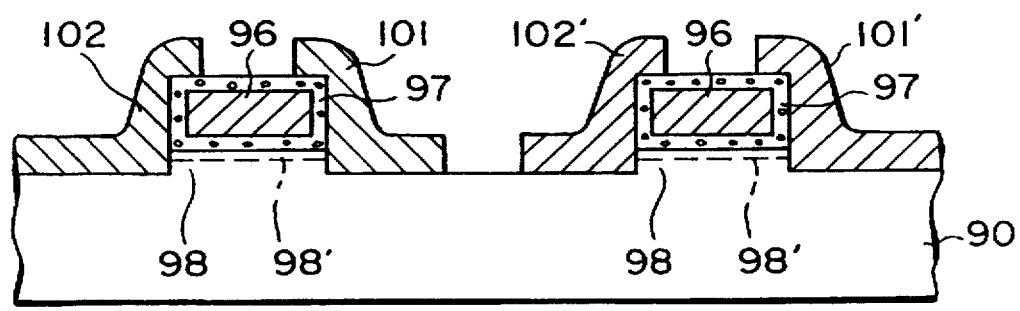
FIG. 15 is a cross-sectional view illustrating an example of the structure of a CMOS transistor to which the present invention is applied.

FIG. 15 shows a substrate constituting a CMOS circuit. In the structure of this embodiment, a couple of MOS transistors as shown in FIG. 15 are adjacently formed in the right and left sides of the substrate 90. However, in these transistors, the left side transistor, for example, can be formed easily as the n-channel transistor, while the right side transistor as the p-channel transistor by adequately changing the materials of the source electrode and drain electrode.

Namely, in the transistors of this embodiment, as is explained previously for the first embodiment, the n-channel transistor can be formed by using a conductive material having a work function which is smaller than that of Si forming the semiconductor region, for example, an oxide conductive material of Al, Ti, Cr, In, Ta, ITO, BaO, SrO or Cs as the material to form the source electrode and drain electrode, while the p-channel transistor can be formed by using a conductive material having a work function which is larger than that of Si forming the semiconductor region, for example, Pt, Au, W, Ni or Mo as the material to form the source electrode and drain electrode.

Accordingly, a CMOS transistor including the n-channel transistor and p-channel transistor can be formed on the same substrate only through selection of the materials of the source electrode 101 and drain electrode 102 of the left side transistor in FIG. 15 and of the source electrode 101' and drain electrode 102' of the right side transistor in FIG. 15. The source electrode 101 or 101' and the drain electrode 102 or 102' can be selectively formed by repeating the photolithographic processings and selectively leaving only the source electrode or drain electrode consisting of the target material by the etching process.

Figure 18:
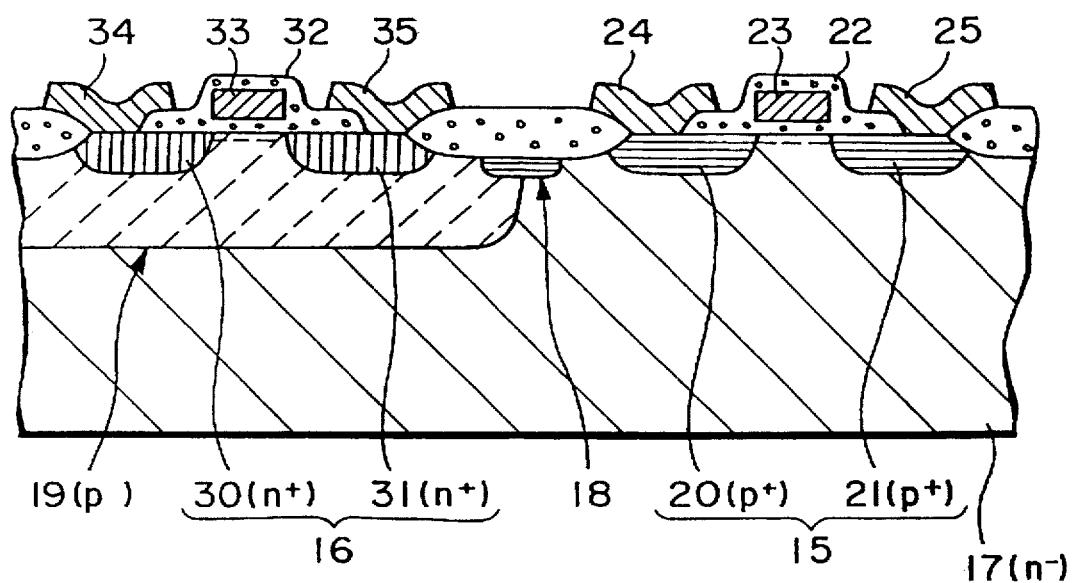
FIG. 18 is a cross-sectional view illustrating an example of a CMOS transistor of the prior art.

Thereby, it is no longer necessary to form the p-well and the guard ring which have been formed in the prior art as explained with reference to FIG. 18 and a degree of freedom in layout is remarkably increased and substrate application area efficiency is improved.

Moreover, according to the method of manufacturing a transistor explained above, since an impurity diffusing process to form the ohmic contact film is eliminated in comparison with the prior art method, the manufacturing process is simplified distinctively and further since a large scale and expensive apparatus for ion-implantation can be ruled out, manufacturing cost can also be reduced.

In above embodiments, the source electrode and drain electrode are formed in the single-layer structure, but it is also effective that these electrodes are formed in the double-layer structure with the area which is in contact with the semiconductor region composed of a metal allowing formation of good schottky barrier.

As explained above, in the structure of the present invention where the source and drain electrodes are connected with the semiconductor region in the field effect transistor, the region for generating a channel in the semiconductor region depending on a voltage of the gate electrode, namely the channel generating region is directly connected with the source electrode and drain electrode. Therefore, the source electrode and drain electrode can be surely placed in direct contact through the channel generated in the semiconductor region with a voltage of the gate electrode, and the contact better than that of the prior art structure is realized. Thus, the ON resistance is lower than in the prior art structure, thereby improving the efficiency of the field effect transistor.

Moreover, when the junction areas of the source electrode and drain electrode and the semiconductor region is formed under the insulated condition including the schottky barrier, the p-channel conductor under the inverse bias condition for the n-channel structure is eliminated. Therefore, the ion-doped semiconductor film which has been required is no longer necessary and the film forming process and etching process are eliminated from the existing processes by removing the ion-doped semiconductor film, simplifying as much the manufacturing processes.

Next, the structure explained above is employed and moreover the source electrode and drain electrode are formed with a material having a work function which is smaller than that of semiconductor forming the semiconductor region. In this case, the n-channel transistor is formed. In practice, a material to form such electrodes includes one of more of Al, Ti, Cr, In, Ta, Cs, indium-tin oxide, BaO and SrO.

Moreover, the structure explained above is employed and a p-channel transistor can be formed by using a material having a work function which is larger than that of semiconductor forming the semiconductor region as the material to form the drain and source electrodes. In practice, such material includes one or more of Pt, Au, W, Ni and Mo.

Meanwhile, when the width of the semiconductor region is narrower than the width of the gate electrode, or if it is wider than that of the gate electrode but is smaller than the value obtained by adding two times the thickness of the insulating film to the width of the gate electrode, the channel is surely connected to the source electrode and drain electrode, realizing good contact between the source electrode and the drain electrode.

In the case of providing a plurality of field effect transistors of the structure explained above on a substrate, the n-channel and p-channel transistors can easily be fabricated on the substrate by selecting the materials of the source electrode and the drain electrode. In this case, the p-well region which has been required in the prior art structure is no longer required and the guard ring which has been required to be provided at the boundary of different kinds of transistors is also no longer necessary. Furthermore, since the n-channel transistor, which are formed only in the p-well region of the substrate in the prior art structure, are formed in the present invention at a desired region on the substrate, the p-channel transistor and n-channel transistor are formed on the same substrate with a free selection of layout and the substrate effective area efficiency is also improved.

What is claimed is:

1. A field effect transistor including a substrate, a source electrode, a drain electrode and a sate electrode, the gate electrode being separated from said source electrode and said drain electrode by an insulating film;

wherein a semiconductor region is provided between said source electrode and said drain electrode, a channel generating region for providing a conductive path through the semiconductor region depending on a voltage of the gate electrode is formed in a portion of said semiconductor region which is closest to said gate electrode, and end regions of the channel generating region directly contacts said drain electrode and said source electrode, and wherein a width of the semiconductor region is wider than a width of the gate electrode and a difference between the width of said semiconductor region and the width of said gate electrode is less than two times a thickness of the insulating film.

2. A field effect transistor according to claim 1, wherein a junction area is formed between said source electrode and said channel generating region, and between said drain electrode and said channel generating region, the junction area including a schottky barrier.

3. A field effect transistor according to claim 2, wherein the field effect transistor is a MOS transistor in which said gate electrode is covered with said insulating film and is provided on the semiconductor region formed on the substrate and said source electrode and said drain electrode are formed on opposite sides of the insulating film over said gate electrode and on opposite sides of the semiconductor region.

4. A field effect transistor according to claim 1, wherein the field effect transistor is a MOS transistor in which said gate electrode is covered with said insulating film and is provided on the semiconductor region formed on the substrate and said source electrode and said drain electrode are formed on opposite sides of the insulating film over said gate electrode and on opposite sides of the semiconductor region.

5. A structure of the field effect transistor according to claim 1, wherein said source electrode and said drain electrode are composed of a material having a work function which is less than that of the semiconductor region, thereby forming an n-channel transistor.

6. A field effect transistor according to claim 5, wherein the material having a work function which is less than that of the semiconductor region comprises one or more selected from the group consisting of Al, Ti, Cr, In, Ta, Cs, indium-tin oxide, BaO, SrO.

7. A structure of the field transistor according to claim 1, wherein said drain electrode and said source electrode are composed of a material having a work function which is greater than that of the semiconductor region, thereby forming a p-channel transistor.

8. A field effect transistor according to claim 7, wherein the material having a work function which is larger than that of the semiconductor region comprises one or more selected from the group consisting of Pt, Au, W, Ni, Mo.

9. A field effect transistor according to claim 1, wherein the semiconductor region is directly connected with the source electrode and the drain electrode without the intermediation of an ion-doped semiconductor film.

10. A MOS field effect transistor comprising:
a substrate having a surface defining a first plane;
a semiconductor region integrally formed on the substrate, the semiconductor region including first and second side surfaces defining a channel width, and an upper surface defining a second plane, the second plane being located above the first plane;

a gate electrode formed over the semiconductor region, the gate electrode having first and second side surfaces defining a gate width;

an insulating film surrounding the gate electrode, the insulating film having a thickness;

a source electrode formed on the insulating film over a first portion of the gate electrode and extending to the surface of the substrate such that the source electrode directly contacts the first side surface of the semiconductor region; and a drain electrode formed on the insulating film over a second portion of the gate electrode and extending to the surface of the substrate such that the drain electrode directly contacts the second side surface of the semiconductor region.

11. A MOS field effect transistor according to claim 10, wherein the channel width is equal to the gate width plus two times a thickness of the insulating film.

12. A CMOS field effect transistor comprising:

a substrate having a surface defining a first plane;

first and second semiconductor regions integrally formed on the substrate, each of the first and second semiconductor regions including first and second side surfaces and an upper surface defining a second plane, the second plane being located above the first plane;

first and second gate electrodes respectively formed over the first and second semiconductor regions, each of the first and second gate electrodes having first and second side surfaces defining a gate width, each of the first and second gate electrodes having a work function value;

first and second insulating films respectively surrounding the first and second gate electrodes, each of the first and second insulating films having a thickness;

first and second source electrodes respectively formed on the first and second insulating films over first portions of the first and second gate electrodes, each of the first and second source electrodes extending to the surface of the substrate such that the first and second source electrodes respectively directly contact the first side surfaces of the first and second semiconductor regions; and first and second drain electrodes respectively formed on the first and second insulating films over second portions of the first and second gate electrodes, each of the first and second drain electrodes extending to the surface of the substrate such that the first and second drain electrodes respectively directly contact the second side surfaces of the first and second semiconductor regions;

wherein the first source electrode and the first drain electrode have a work function value which is greater than the work function value of the first semiconductor region; and wherein the second source electrode and the second drain electrode have a work function value which is less than the work function value of the second semiconductor region.

13. A field effect transistor including a substrate, a source electrode, a drain electrode and a gate electrode, the gate electrode being separated from said source electrode and said drain electrode by an insulating film;

wherein a semiconductor region is provided between said source electrode and said drain electrode, a channel generating region for providing a conductive path through the semiconductor region depending on a voltage of the gate electrode is formed in a portion of said semiconductor region which is closest to said gate electrode, and end regions of the channel generating region directly contacts said drain electrode and said source electrode, and wherein a width of the semiconductor region is wider than the width of the gate electrode and a difference between the width of said semiconductor region and the width of said gate electrode is less than two times a thickness of the insulating film;

wherein the field effect transistor is a thin film transistor for driving a liquid crystal in a liquid crystal array in which said gate electrode is formed on the substrate and is covered with said insulating film, said semiconductor region is formed on said insulating film and said source electrode and said drain electrode are formed on opposite sides of the semiconductor region over end portions thereof and are positioned in spaced apart alignment.

14. A field effect transistor including a substrate, a source electrode, a drain electrode and a gate electrode, the gate electrode being separated from said source electrode and said drain electrode by an insulating film;

wherein a semiconductor region is provided between said source electrode and said drain electrode, a channel generating region for providing a conductive path through the semiconductor region depending on a voltage of the gate electrode is formed in a portion of said semiconductor region which is closest to said gate electrode, and end regions of the channel generating region directly contacts said drain electrode and said source electrode, and wherein a width of the semiconductor region is wider than the width of the gate electrode and a difference between the width of said semiconductor region and the width of said gate electrode is less than two times a thickness of the insulating film;

wherein a junction area is formed between said source electrode and said channel generating region, and between said drain electrode and said channel generating region, the junction area including a schottky barrier, and wherein the field effect transistor is a thin film transistor for driving a liquid crystal in a liquid crystal array in which said gate electrode is formed on the substrate and is covered with said insulating film, said semiconductor region is formed on said insulating film and said source electrode and said drain electrode are formed on opposite sides of the semiconductor region over end portions thereof and are positioned in spaced apart alignment.

* * * * *

UNITED STATES PATENT AND TRADEMARK OFFICE
CERTIFICATE OF CORRECTION

PATENT NO.   : 5,801,398
DATED        : September 1, 1998
INVENTOR(S)  : Hiroyuki Hebiguchi It is certified that error appears in the above-indentified patent and that said Letters Patent is hereby corrected as shown below:

In the Claims

In Claim 1, line 2, replace "sate" with --gate--.

Signed and Sealed this

Eighteenth Day of May, 1999

Attest:

Q. TODD DICKINSON

Attesting Officer

Acting Commissioner of Patents and Trademarks